(12) United States Patent
Baldwin et al.

(10) Patent No.: US 7,119,999 B2
(45) Date of Patent: Oct. 10, 2006

(54) PRE-REGULATOR WITH REVERSE CURRENT BLOCKING

(75) Inventors: David Baldwin, Allen, TX (US); Eric Blackall, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 109 days.

(21) Appl. No.: 10/805,743

(22) Filed: Mar. 20, 2004

(65) Prior Publication Data

US 2005/0206437 A1  Sep. 22, 2005

(51) Int. Cl.
*H02H 3/18* (2006.01)

(52) U.S. Cl. ...................................... 361/84

(58) Field of Classification Search ................. 361/84, 361/58
See application file for complete search history.

(56) References Cited

U.S. PATENT DOCUMENTS

| | | | | |
|---|---|---|---|---|
| 4,390,833 A | * | 6/1983 | Tzeng | .................. 323/280 |
| 5,012,381 A | * | 4/1991 | Elliott et al. | .................. 361/84 |
| 5,027,250 A | * | 6/1991 | Cini et al. | .................. 361/90 |
| 5,424,892 A | * | 6/1995 | Topp et al. | .................. 361/18 |
| 5,648,739 A | * | 7/1997 | Walther et al. | .............. 327/330 |
| 5,682,050 A | * | 10/1997 | Williams | ..................... 257/368 |
| 5,909,135 A | * | 6/1999 | Baldwin et al. | ............. 327/328 |
| 6,590,440 B1 | * | 7/2003 | Williams et al. | ........... 327/396 |
| 6,650,100 B1 | * | 11/2003 | Kohout et al. | .............. 323/282 |
| 6,678,829 B1 | * | 1/2004 | Teggatz et al. | ............. 713/300 |
| 6,788,130 B1 | * | 9/2004 | Pauletti et al. | ............. 327/536 |
| 2004/0239403 A1 | | 12/2004 | Farley | |

* cited by examiner

*Primary Examiner*—Ronald Leja
(74) *Attorney, Agent, or Firm*—William B Kempler; W. James Brady; Frederick J. Telecky, Jr.

(57) ABSTRACT

An apparatus includes a blocking N-channel MOS (LDMOS) transistor that prevents current flow when the supply connection is reversed. When connected properly, the body diode conducts to provide a start-up function. A bias generator is employed to enable the low drop-out voltage function, allowing the output voltage to be very close to supply.

14 Claims, 1 Drawing Sheet

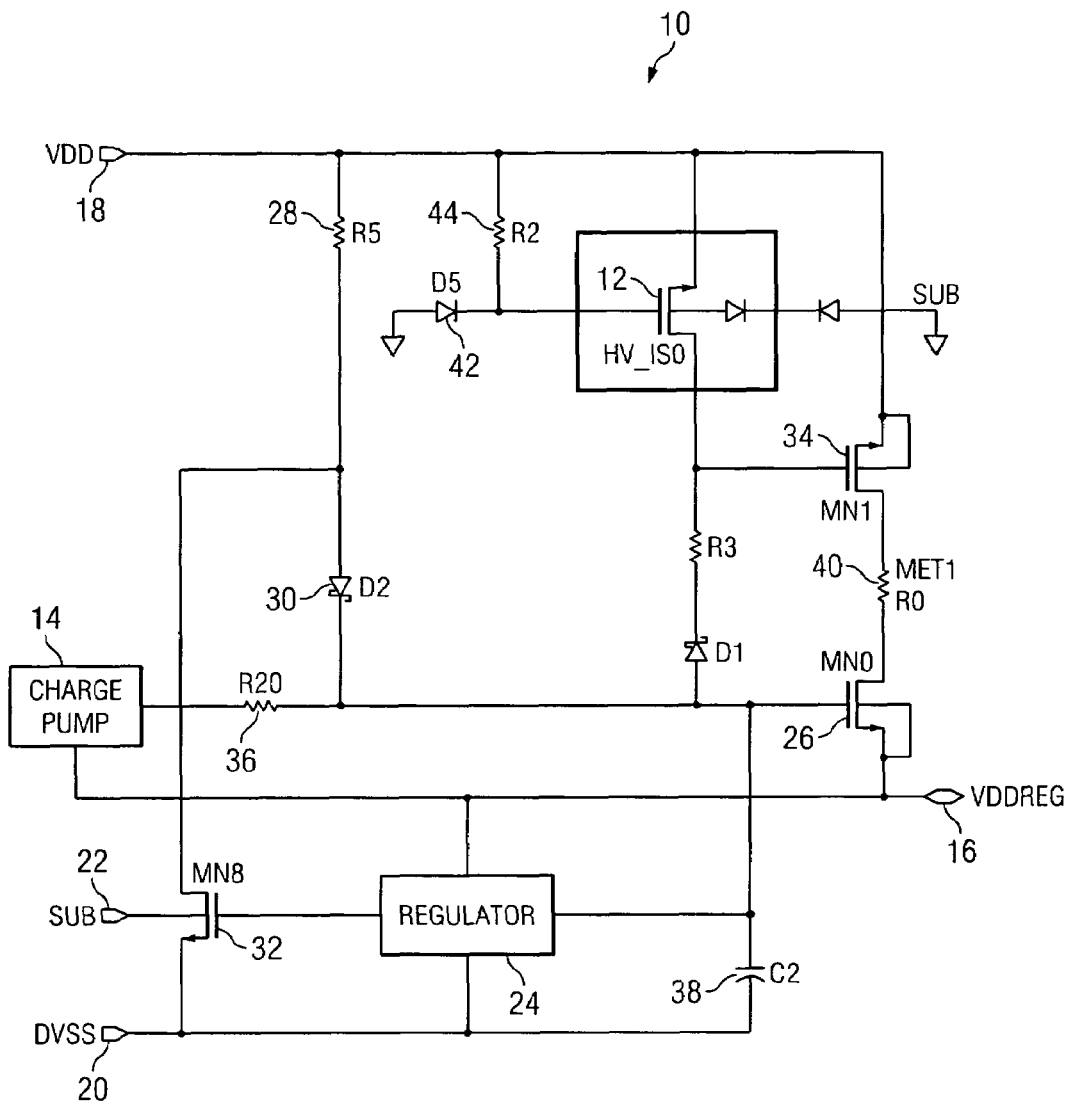

PRE-REGULATOR WITH REVERSE CURRENT BLOCKING

BACKGROUND OF THE INVENTION

1. Field of the Invention

This invention relates generally to voltage regulators, and more particularly to a methodology that employs reverse current blocking via a lateral double-diffused MOS (LD-MOS) device to block the current flow when the supply connection is reversed.

2. Description of the Prior Art

Junction isolated IC processes must be protected against reverse supply connection. In many instances, this is done within the system, where an external component is placed to perform this function. In small, highly integrated systems however, it is desired or required to eliminate the external blocking component. Known solutions consist of PMOS or bipolar PNP transistor protection. Such solutions, in certain applications such as pre-regulators, are not area efficient.

In view of the foregoing, it would be both beneficial and advantageous to provide a reverse current blocking technique and that does not employ PMOS, bipolar PNP, or external circuit current blocking devices to block the current flow when the supply connection is reversed.

SUMMARY OF THE INVENTION

To meet the above and other objectives, the present invention provides an N-channel MOS transistor that blocks the current flow when the supply connection is reversed. When connected properly, the body diode conducts to provide a start-up function. A pre-regulator using the N-channel MOS transistor also employs a bias generator to enable the low drop-out voltage function, allowing the output voltage to be very close to supply.

The pre-regulator is advantageous in that it eliminates the need to employ external blocking diodes or mosfets. Another advantage provided by the pre-regulator is that it allows for lower drop-out voltage performance than that achievable using an external diode. Yet another advantage provided by the pre-regulator is associated with lower system costs, offering a competitive advantage to end users; and a competitive advantage in low-cost competitive markets.

According to one embodiment, an apparatus comprises a reverse current blocking circuit devoid of PMOS, bipolar PNP, and external circuit protection devices, wherein the reverse current blocking circuit is operational to protect the apparatus against reverse current flow in a high side connected to a supply voltage and against reverse current flow in a low-side connected to ground.

According to another embodiment, an apparatus comprises means for protecting the apparatus against reverse supply voltage connections, wherein the reverse supply voltage connection protecting means is devoid of PMOS devices, bipolar PNP devices, and protection devices external to the apparatus.

According to yet another embodiment, an apparatus operates to pass a supply voltage to an output node below a desired regulation level, wherein the apparatus is protected against a reverse supply connection without use of PMOS, bipolar PNP, or external pre-regulator protection devices.

According to still another embodiment, a method of protecting an apparatus against reverse supply connections comprises the steps of:

providing an apparatus reverse current blocking circuit in electrical communication with an output node and that is devoid of PMOS devices, bipolar PNP devices, and external circuit protection devices; and preventing reverse current flow in at least one electrical path selected from the group consisting of a high side path connected to a supply voltage, and a low-side path connected to ground.

BRIEF DESCRIPTION OF THE DRAWINGS

Other aspects and features of the present invention and many of the attendant advantages of the present invention will be readily appreciated, as the invention becomes better understood by reference to the following detailed description when considered in connection with the accompanying drawing FIGURE thereof and wherein:

The FIGURE is a schematic diagram illustrating a pre-regulator with reverse blocking capability according to one embodiment of the present invention.

While the above-identified drawing FIGURE sets forth a particular embodiment, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

The FIGURE is a schematic diagram illustrating a pre-regulator circuit 10 with reverse blocking capability according to one embodiment of the present invention. As stated herein before, junction isolated IC processes must be protected against reverse supply connection. In many instances, this is done within the system, where an external component is placed to perform this function. In small, highly integrated systems such as pre-regulator circuit 10 however, it is desired or required to eliminate the external blocking component. Known solutions, as also stated herein before, consist of PMOS or bipolar PNP transistor protection that are not efficient in certain applications such as pre-regulators.

Looking again at the FIGURE, the pre-regulator circuit 10 can be seen to include an LDMOS transistor 34. The LDMOS transistor 34 is configured to block the flow of supply current whenever the supply VDD connection is inadvertently reversed. When VDD is connected properly, the LDMOS 34 body diode conducts to provide a start-up function. A diode D2 (30) also serves to start up the regulator. A charge pump (bias generator) 14 is used to enable the low drop-out voltage function, allowing the output voltage VDDREG 16 to be very close to the supply voltage VDD. Since the LDMOS transistor 34 provides a lower specific on resistance than that achievable when using PMOS or bipolar PNP protection devices, it provides a solution with a very competitive size and cost.

A more detailed functional description of the pre-regulator circuit 10 is now described herein below with continued reference to the FIGURE. The input voltage appears at the VDD pin 18 at the top of the FIGURE. Under normal circumstances, this pin 18 is always positive with respect to the DVSS and SUB pins 20, 22 respectively, that eventually tie to the same point at ground (OV) potential. The function of the pre-regulator circuit 10 is to take the supply voltage at the VDD pin 18 and pass it through to VDDREG 16 below the regulation point (6V in one application) in a "Low-Drop-Out" manner (a low impedance is seen between the VDD and VDDREG pins 18 and 16 respectively; so the I*R drop seen these two pins 16, 18 is small). Above the regulation point (when VDD−I*R>Vreg, where Vreg is 6V in one application), the "Regulator" block 24 pulls down the gate of MN0 (26) to hold the output at the regulation point. The function of the "Charge Pump" (bias generator) block 14 is to form a bias current for the output of the regulator 24 to work against and to also ensure that there is potentially enough excess voltage on the gate of MN0 (26) to ensure that it is in a low on-resistance area of operation.

Resistor R5 (28) and diode D2 (30) are provided for start-up, when the charge pump 14 has not been functioning, and the gate of MN0 (26) is very close to ground. In this instance, MN8 (32) is off, and current flows into the node connected to the gate of MN0 (26), pulling it up, and in turn allowing VDDREG 16 to rise. Once there is voltage at the output, the charge pump 14 will begin to operate and assist in getting voltage to MN0 (26). When regulation is attained, MN8 (32) is turned on, which reverses the diode D2 (30), disabling the start-up. It should be noted that MN8 (32) is not essential to the operation of the circuit 10 as a whole, but is present only to reduce the dependence of VDDREG 16 on VDD.

In normal operation, HV ISO (12) is not important when input voltages much in excess of the regulation point are present. In this case, MN1 (34) presents itself as a diode (the inherent junction between the source and drain of MN1 (34)—it is physically impossible to remove this part of the device). In the case of low-dropout operation, MN1 (34) is turned on via the bias generator (charge pump) 14, charging the gate of MN1 (34) through D1 and R3. In this mode of operation, MN1 (34) is turned on, allowing it to shunt the diode, thereby reducing the dropout voltage. It should be noted that the forward biasing of this device (MN1 (34)) junction creates a parasitic PNP device with its collector at substrate; so it may be advantageous to actually turn this device on in some cases. A second charge pump (not shown) can be employed to do this, by injecting charge into the gate of MN1 (34).

Resistor R20 (36) forms a low-pass filter with capacitor C2 (38) to filter out the noise caused by the operation of the charge pump. The MET1 resistor R0 (40) is not essential to the operation of the circuit 10, but is used in this embodiment as a current measurement device by which MN0 (26) can be turned-off in the case of an overload condition at the output, VDDREG 16. This feature is not shown.

In reverse connection, the VDD pin 18 will go below ground, and current flow must be controlled. If MN0 (26) were simply to have its drain connected to VDD 18, the circuit 10 would be much simpler; but the presence of the deep NWELL drain on this device (MN0 (26)) means that it has a forward-biased junction present between substrate, SUB 22, (ground) and VDD 18 in the instant case. In order to prevent this undesirable condition, the present inventors connected two devices (MN0 (26) and MN1 (34)) with the drains (NWELL regions) common. In this way, current can be controlled in the case of either polarity: MN0 (26) controls in normal operation, and MN1 (34) controls flow (prevents it) in reverse conditions.

MN1 (34) prevents reverse current flow in the following manner: The isolated HV_ISO transistor 12 is biased on by diode D5, which holds the gate of MN1 (34) to VDD. In this way, the gate-source voltage, Vgs, of MN1 (34) is zero and this device is then biased off. Reverse flow will also occur from MN8 (32) and diode D5 (42); but this is controlled by the resistors 28, 44 respectively placed in series with them between VDD 18 and ground.

In view of the above, it can be seen the present invention presents a significant advancement in the art of voltage regulator technology. Further, this invention has been described in considerable detail in order to provide those skilled in the reverse current blocking art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. An apparatus comprising a reverse current blocking circuit devoid of PMOS, bipolar PNP, and external circuit protection devices, wherein the reverse current blocking circuit is operational to protect the apparatus against reverse current flow; wherein the reverse blocking circuit comprises:
   an N-channel MOS isolation transistor; and
   an N-channel MOS blocking transistor, wherein a reverse supply voltage connection operates to turn-on the N-channel MOS isolation transistor, and further wherein the turn-on of the N-channel MOS isolation transistor operates to turn-off the N-channel MOS blocking transistor to prevent the flow of reverse current there through in response to the reverse supply voltage connection;
   a regulated voltage output node;
   a voltage regulator output N-channel MOS transistor having its drain coupled to the drain of the N-channel MOS blocking transistor, and further having its source connected to the output node;
   a bias generator operational to generate a bias current for the voltage regulator output N-channel MOS transistor; and
   a regulator operational to control the gate of the voltage regulator output N-channel MOS transistor to hold the regulated voltage output node at a desired regulation point.

2. The apparatus according to claim 1, wherein the N-channel isolation MOS transistor comprises an isolated NMOS transistor.

3. The apparatus according to claim 1, wherein the N-channel MOS blocking transistor comprises an NMOS transistor.

4. The apparatus according to claim 1, wherein the N-channel MOS blocking transistor comprises a Lateral double-diffused LDMOS transistor.

5. The apparatus according to claim 1, wherein the N-channel MOS blocking transistor comprises a drain-extended DE NMOS transistor.

6. An apparatus comprising means for protecting the apparatus against reverse supply voltage connections, wherein the reverse supply voltage connection protecting means is devoid of PMOS devices, bipolar PNP devices, and protection devices external to the apparatus;
   a regulated voltage output node; and
   means for passing a supply voltage to the regulated voltage output node below a desired regulation level;

wherein the means for passing a supply voltage to the regulated voltage output node below a desired regulation level comprises:
  a voltage regulator output N-channel MOS transistor having its drain coupled to the drain of an N-channel MOS blocking transistor, and further having its source connected to the output node;
  a bias generator operational to generate a bias current for the voltage regulator output N-channel MOS transistor; and
  a regulator operational to control the gate of the voltage regulator output N-channel MOS transistor to hold the regulated voltage output node at a desired regulation point.

7. The apparatus according to claim 6, wherein the reverse supply voltage connection protecting means is operational to protect the apparatus against reverse current flow in a high side current path connected to a supply voltage.

8. The apparatus according to claim 6, wherein the reverse supply voltage connection protecting means is operational to protect the apparatus against reverse current flow in a low side current path connected to ground.

9. The apparatus according to claim 6, wherein the reverse supply voltage connection protecting means comprises:
  an N-channel MOS isolation transistor; and
  the N-channel MOS current blocking transistor, wherein a reverse supply voltage connection operates to turn-on the N-channel MOS isolation transistor, and further wherein the turn-on of the N-channel MOS isolation transistor operates to turn-off the N-channel MOS current blocking transistor to prevent the flow of reverse current there through in response to the reverse supply voltage connection such that the means for passing a supply voltage to the regulated voltage output node below a desired regulation level is protected against the reverse supply connection.

10. The apparatus according to claim 8, wherein the N-channel isolation MOS transistor comprises an isolated NMOS transistor.

11. The apparatus according to claim 8, wherein the N-channel MOS blocking transistor comprises an NMOS transistor.

12. The apparatus according to claim 8, wherein the N-channel MOS blocking transistor comprises a Lateral double-diffused LDMOS transistor.

13. The apparatus according to claim 8, wherein the N-channel MOS blocking transistor comprises a drain-extended DE NMOS transistor.

14. An apparatus operational to pass a supply voltage to an out put node below a desired regulation level, wherein the apparatus is protected against a reverse supply connection without use of PMOS, bipolar PNP, or external pre-regulator protection devices comprising:
  a N-channel MOS isolation transistor; and
  a N-channel MOS current blocking transistor, wherein a reverse supply voltage connection operates to turn-on the N-channel MOS isolation transistor, and further wherein the turn-on of the N-channel MOS isolation transistor operates to turn-off the N-channel MOS current blocking transistor to prevent the flow of reverse current there through in response to the reverse supply voltage connection such that the apparatus is protected against the reverse supply connection; and
  a voltage regulation circuit comprising:
    a voltage regulator output N-channel MOS transistor having its drain coupled to the drain of the N-channel MOS current blocking transistor, and further having its source connected to the output node;
  a bias generator operational to generate a bias current for the voltage regulator output N-channel MOS transistor; and
  a regulator operational to control the gate of the voltage regulator output N-channel MOS transistor to hold the regulated voltage output node at a desired regulation point.

* * * * *